United States Patent
Gooth et al.

(10) Patent No.: US 10,545,357 B2
(45) Date of Patent: Jan. 28, 2020

(54) PROGRAMMABLE METAMATERIAL

(71) Applicant: International Business Machines Corporation, Armonk, NY (US)

(72) Inventors: Johannes Gooth, Horgen (CH); Bernd Gotsmann, Horgen (CH); Fabian Menges, Urdorf (CH)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 15/685,087

(22) Filed: Aug. 24, 2017

(65) Prior Publication Data
US 2019/0064551 A1    Feb. 28, 2019

(51) Int. Cl.
| | |
|---|---|
| *G02B 26/00* | (2006.01) |
| *G02F 1/29* | (2006.01) |
| *G02B 26/08* | (2006.01) |
| *G02F 1/00* | (2006.01) |
| *H01L 27/24* | (2006.01) |
| *H01L 45/00* | (2006.01) |

(Continued)

(52) U.S. Cl.
CPC .......... *G02F 1/0054* (2013.01); *G02F 1/0147* (2013.01); *G11C 13/0004* (2013.01); *G11C 13/047* (2013.01); *H01L 27/2463* (2013.01); *H01L 45/065* (2013.01); *H01L 45/126* (2013.01); *H01L 45/146* (2013.01); *G02F 2202/10* (2013.01); *G02F 2202/30* (2013.01)

(58) Field of Classification Search
CPC ...... G02B 27/2278; G02B 6/10; G02B 6/105; G02B 6/107; G02B 6/1225; G02F 1/0105; G02F 1/0107; G02F 1/0147; G02F 1/03; G02F 1/035; G02F 1/19; G02F 1/3515; G02F 1/3525; G02F 2202/32; G02F 2203/34
USPC ........ 359/237, 242, 265–267, 290–292, 295, 359/298
See application file for complete search history.

(56) References Cited

U.S. PATENT DOCUMENTS

| | | |
|---|---|---|
| 7,113,673 B2 | 9/2006 | Lipson et al. |
| 8,259,381 B2 | 9/2012 | Kaye et al. |

(Continued)

OTHER PUBLICATIONS

Gooth et al., "Reconfigurable Interference", U.S. Appl. No. 16/251,197, filed Jan. 18, 2019.

(Continued)

*Primary Examiner* — Brandi N Thomas
(74) *Attorney, Agent, or Firm* — James L. Olsen

(57) ABSTRACT

Embodiments of the present disclosure relate to a programmable metamaterial which comprises an array of phase-change material elements. A domain inducing component may be coupled to at least one phase-change material element of the array of phase-change material elements. The domain inducing component may be configured to program the refractive index of the at least one phase-change material element and reprogram the refractive index of the at least one phase-change material element by inducing a phase transition in a domain of the at least one phase-change material element. A method for programming the metamaterial may include selecting the phase-change material element for programming and programming the refractive index of the selected phase-change material element by inducing a phase transition in a domain of the selected phase-change material element.

20 Claims, 6 Drawing Sheets

(51) Int. Cl.
G11C 13/00 (2006.01)
G11C 13/04 (2006.01)
G02F 1/01 (2006.01)

(56) References Cited

U.S. PATENT DOCUMENTS

| 8,655,189 | B2 | 2/2014 | Almassy et al. |
| 8,797,382 | B2 | 8/2014 | Li et al. |
| 8,867,121 | B2 | 10/2014 | Lavrentovich et al. |
| 8,917,440 | B2* | 12/2014 | Kim .................. G02F 1/0147 359/298 |
| 2011/0175047 | A1 | 7/2011 | Ramanathan et al. |
| 2012/0056148 | A1* | 3/2012 | Kakegawa .......... H01L 27/2463 257/4 |
| 2016/0149113 | A1* | 5/2016 | Yang .................. H01L 41/047 359/824 |

OTHER PUBLICATIONS

IBM, List of IBM Patents or Patent Applications Treated as Related, Jan. 17, 2019, 2 pages.

Cui et al., "Coding metamaterials, digital metamaterials and programmable metamaterials," Light: Science & Applications, 2014, 3, e218, pp. 1-9. DOI: 10.1038/lsa.2014.99.

Liu et al, "Three-dimensional photonic metamaterials at optical frequencies," Nature Materials, Jan. 2008 (published online: Dec. 2007), vol. 7, pp. 31-37.

Rensberg et al., "Active Optical Metasurfaces Based on Defect-Engineered Phase-Transition Materials," Nano Letters, 2016, vol. 16, No. 2, pp. 1050-1055 (Abstract).

Silva et al., "Performing Mathematical Operations with Metamaterials," Science, Jan. 2014, vol. 343, pp. 160-163.

Soukoulis et al., "Past achievements and future challenges in the development of three-dimensional photonic metamaterials," Nature Photonics, vol. 5, 2011, pp. 523-530. DOI: 10.1038/nphoton.2011.154.

Wang et al., "Optically Reconfigurable Photonic Devices," arXiv.org, Physics, arXiv: 1508.03818, submitted: Aug. 16, 2015, last revised Oct. 18, 2015, pp. 1-12. https://arxiv.org/ftp/arxiv/papers/1508/1508.03818.pdf.

Wang et al., "Optically reconfigurable metasurfaces and photonic devices based on phase change materials," Nature Photonics, Jan. 2016, vol. 10, pp. 60-65.

Wen et al., "Helicity multiplexed broadband metasurface holograms," Nature Communications, vol. 6, Article No. 8241, Sep. 10, 2015 (received May 13, 2015), pp. 1-7. DOI: 10.1038/ncomms9241.

Yu et al., "Flat optics with designer metasurfaces," Nature Materials, vol. 13, Feb. 2014, pp. 139-150. DOI: 10.1038/nmat3839.

Zheludev et al., "From metamaterials to metadevices," Nature Materials, Nov. 2012, vol. 11, pp. 917-924. DOI: 10.38/nmat3431.

"Distributed Bragg reflector," Wikipedia, printed: Jul. 18, 2017, pp. 1-3. https://en.wikipedia.org/wiki/Distributed_Bragg_reflector.

Fisher, B., "Metal-semiconductor domain configurations during switching of VO2 single crystals," Journal of Physics C: Solid State Physics, 1976, vol. 9, No. 7, pp. 1201-1209.

Fisher, B., "Moving boundaries and travelling domains during switching of VO2 single crystals," Journal of Physics C: Solid State Physics, 1975, vol. 8, No. 13, (Abstract). http://iopscience.iop.org/article/10.1088/0022-3719/8/13/016.

Gu et al., "Current-Driven Phase Oscillation and Domain-Wall Propagation in $W_xV_{1-x}O_2$ Nanobeams," Nano Letters, 2007, vol. 7, No. 2, pp. 363-366.

Hendrickson et al., "Electrically actuated phase-change pixels for transmissive and reflective spatial light modulators in the near and mid infrared," Applied Optics, Dec. 20, 2015, vol. 54, Issue 36, pp. 10698-10704, OSA Publishing. https://doi.org/10.1364/AO.54.010698.

Kumar et al., "Chapter 17: Tunable Hollow Optical Waveguide and Its Applications," from "Frontiers in Guided Wave optics and Optoelectronics," (Edited by: Bishnu Pal), Feb. 2010, pp. 343-363.

Rude et al., "Ultrafast and Broadband Tuning of Resonant Optical Nanostructures Using Phase-Change Materials," arXiv.org, Physics, arXiv:1506.03739, submitted: Jun. 11, 2015, last revised: Oct. 29, 2015, pp. 1-12. https://arxiv.org/ftp/arxiv/papers/1506/1506.03739.pdf.

Wang et al., "Tunable Bragg filters with a phase transition material defect layer," Optics Express, Sep. 5, 2016, vol. 24, No. 18, pp. 20365-20372, OSA Publishing. http://dx.doi.org/10.1364/OE.24.020365.

Gooth et al., "Reconfigurable Interference," U.S. Appl. No. 15/685,064, filed Aug. 24, 2017.

List of IBM Patents or Patent Applications Treated as Related, Signed Aug. 24, 2017, 2 pages.

* cited by examiner

PROGRAMMABLE METAMATERIAL

BACKGROUND

The present disclosure relates generally to the field of metamaterials, and more specifically, to programmable metamaterials.

Metamaterials are artificial materials which are capable of influencing the propagation of electromagnetic radiation through interacting structures which are small compared to a given design wavelength. Microscopic split-ring resonators on a planar substrate are a basic example of a two-dimensional metamaterial or metasurface which can also be extended into the third dimension by repetition. The optically accessed microscopic structures of a metamaterial can be designed in a way that the resulting material features optical properties which cannot be found in natural materials. For instance, it is possible to create metamaterials with a negative refractive index. Numerous further applications such as optical computing, perfect lancing and absorption, or customized nonlinear optical devices are envisioned.

SUMMARY

It is an objective of the present disclosure to provide for a programmable metamaterial and a method for programming said programmable metamaterial. Embodiments of the present disclosure can be freely combined with each other if they are not mutually exclusive.

Embodiments of the present disclosure relate to a programmable metamaterial which comprises an array of phase-change material elements. A domain inducing component may be coupled to at least one phase-change material element of the array of phase-change material elements. The domain inducing component may be configured to program the refractive index of the at least one phase-change material element and reprogram the refractive index of the at least one phase-change material element by inducing a phase transition in a domain of the at least one phase-change material element.

In another aspect, the present disclosure provides for a method for programming a metamaterial. The method may include selecting a phase-change material element of the programmable metamaterial for programming. The method may further include programming the refractive index of the selected phase-change material element by inducing a phase transition in a domain of the selected phase-change material element.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
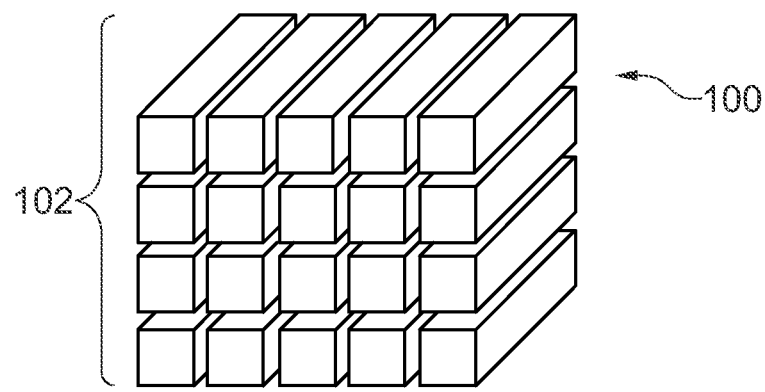
FIG. 1 is a schematic of an array of phase-change material elements, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Many of the various forms of metamaterials which have been designed or proposed so far are lacking configurability at least to a certain degree. Metamaterials have been proposed in various aesthetic forms, which cannot be altered after manufacturing. The structured conductive strips on a circuit board and arrangements of nanospirals are two examples of such devices. Static metamaterials are designed to serve a specific and limited purpose and are often tailored to a particular, limited working range of wavelengths.

One class of metamaterials is the group of programmable or configurable photonic devices, a sub-class of which are reprogrammable or reconfigurable metamaterials. Configurable metamaterials can be made using phase-change materials, where the refractive index and/or the electric conductivity of an otherwise non-conducting or semi-conducting material may be changed locally for the purpose of programming the material with a pattern or structure which is supposed to interact with light of a sufficiently long wavelength in a desirable manner. Reprogrammable metamaterials are those where the locally induced phase transitions are reversible such that programming can be repeated with a cleared material. An exemplary publication documenting the state of the art is "Optically configurable metasurfaces and photonic devices based on phase change materials" by Qian Wang et al., Nature Photonics 10, 60-65 (2016).

To date, the programmable metamaterials have been proposed only as two-dimensional metasurfaces as the first dimension is needed to control the structures where the change of phase is to be introduced, for example by providing electrical contacts for phase-change pixels, or by providing vertical space for a programming beam of laser light. Metastructures which may be created by means of reconfigurable metamaterial devices according to the state of the art are therefore limited by topology in their capability of controlling light propagation.

The presently disclosed programmable metamaterial addresses several needs which are not or merely insufficiently satisfied by the state of the art. Light propagates in three-dimensional ways which can be characterized by various parameters such as amplitude, phase, wavelength or frequency, polarization, and propagation direction. An increasing number of technologies and applications use optical technologies for light processing. Optical devices are often static parts which serve a particular purpose and have to be exchanged if a different function is needed to process light with a different function. Many optical devices could be simplified or combined with each other if they contained configurable optical parts which may change their optical behavior by means of electrical control instead of having to remove or replace such parts.

Furthermore, a programmable three-dimensional optical device would be beneficial to make full use of configurability and allow for a maximum of control of the light propagation process. Therefore, embodiments of the present disclosure seek to provide a reconfigurable, tunable, and/or reprogrammable metamaterial which may be implemented in up to three dimensions and offer a maximum degree of flexibility to influence light in various arbitrary and replaceable ways.

In the following, preferred and/or exemplary embodiments of the present disclosure are discussed with reference to the figures. It is understood that the embodiments discussed in the text and shown in the figures are only of illustrative nature. A person of ordinary skill in the art will naturally be able to combine, replace, extend, or otherwise vary the disclosed features without departing from the scope and spirit of the present disclosure.

Aspects of the present disclosure provide for a programmable metamaterial which comprises an array of phase-change material elements. The phase-change material elements may be oblong shape, such that each phase-change material element offers a one-dimensional degree of freedom for optical programming. It is, however, also possible to design the phase-change material elements with a different structure, such that they may be programmed in more than one direction. For the purpose of demonstrating the basic ideas of the present disclosure, several implementations where the phase-change material elements are linearly programmable will be discussed.

The programmable metamaterial may be formed by a number of phase-change material elements which are arranged in an array. Each of the phase-change material elements may be independently programmed with localized areas of a different refractive index. This is achieved by means of the domain inducing components which are adapted for delivering a sufficient amount of energy into the phase-change material elements to commence a transition into a thermodynamical phase of the phase-change material which is characterized, possibly amongst other properties, by a different refractive index. The phase-change material elements may be arranged in a one-dimensional pattern such that the array forms a two-dimensional programmable metasurface. However, the phase-change material elements may also be advantageously arranged in a two-dimensional manner to form a programmable three-dimensional metamaterial.

The domain-inducing components are adapted for performing the phase transition in the phase-change material in forward direction (e.g., increasing the internal energy of the phase-change material locally) or in the backwards direction (e.g., lowering the internal energy). These two functions may be used to switch the local phase of the phase-change material from one state to the respective other state, which may be beneficially used for programming and reprogramming each of the phase-change material elements.

According to an embodiment, at least one of the phase-change material elements is electrically contacted by a bias electrode on each end, or other termini. This may allow for passing an electrical current through the contacted phase-change material elements. The resulting Peltier effect leads to shifting the domain through the phase-change material element. This may substantially increase the degrees of freedom for programming the phase-change material elements. Arbitrary sequences or patterns of domains with different refractive indices may thus be programmed onto each of the electrically contacted phase-change material elements, the resolution being limited primarily by the size of the domain-inducing component. In combination with the mentioned array structure of the phase-change material elements, two- or three-dimensional metamaterials with practically arbitrary metastructures may be created by applying a suitable programming scheme involving creating and shifting domains with a changed refractive index.

Moreover, the possibility of transmitting an electrical current through the phase-change material elements may offer an alternative way of reprogramming the metamaterial. Existing domains can simply be shifted towards an end of the phase-change material element, where the domains get destroyed as the latent heat stored within the domains gets transported away with the electrical current. During this process, new domains may be programmed onto the phase-change material element until reprogramming is finished.

Another advantage of electrically contacted phase-change material elements may be the possibility to apply a time-dependent programming scheme. Hence, a metamaterial is provided whose optical behavior may be controlled to change over time. The disclosed metamaterial may therefore be implemented as an active optical element in a wide range of possible applications.

Generally, the disclosed programmable metamaterial may provide an electrically controllable means for influencing amplitude and/or phase of light in two or three dimensions. The programmable metamaterial may be scalable down to the nanoscale, allowing for a high optical and/or data integration density. It may further require less static lithographically defined structures, which may result in reduced production costs.

An exemplary array 100 of phase-change material elements 102 is depicted in FIG. 1, in accordance with embodiments of the present disclosure. Twenty phase-change material elements 102 with a square cross-section are arranged in a regular 4×5 square pattern. All phase-change material elements 102 are oriented in parallel and separated from each other by gaps of a constant width in both directions which is smaller than the diameter of the phase-change material elements 102. Their cross-section does not necessarily have to be a square; however, this configuration may be advantageous as the surfaces of all phase-change material elements 102 in the same row or column coincide in one plane. It may be generally advantageous to select the cross-section according to the pattern upon which the array is formed, e.g. hexagonal if the phase-change material elements are arranged in a hexagonal pattern. Other regular or irregular cross-sections may be used nonetheless, depending on specific application requirements or manufacturing conditions.

Irrespective of the selected cross-section, it is recommendable that the phase-change material elements do not come into physical contact with each other in embodiments where an electrical current is used to move the domains through the phase-change material elements, as this may result in leakage of charge carriers between neighboring phase-change material elements, which would corrupt a controlled movement of the domains. On the other hand, it may be advantageous that the gaps between the phase-change material elements are as small as possible in order to maximize the active volume of the metamaterial.

The array structure is scalable over a wide range of orders of magnitude. According to an embodiment, the phase-change material elements have a diameter between 1 nm and 100 µm. A lower limit for the diameter of the phase-change material elements is governed by the smallest available technology node, which lies currently at about 1 nm. This structure size may serve as a metastructure for wavelengths down to the ultraviolet (UV) and possibly even for the longest X-ray wavelengths between 4 and 10 nm. The upper structure size limit is generally arbitrary, but may be identified in accordance with those wavelength regions where optical technologies are common. A practical upper limit for the diameter of the phase-change material elements is 100 µm, which corresponds to applications in the terahertz range. Thus, in some embodiments, applications of the disclosed programmable metamaterial may be envisioned for the ultraviolet, optical, infrared (IR) and/or terahertz (THz), submillimeter or millimeter range.

The phase-change material elements may have an axial extension larger than its diameter. According to an embodiment, the phase-change material elements have an aspect ratio of 10:1. An aspect ratio of 10:1 may provide sufficient space in the axial direction for interaction between the metastructure and the light to be processed.

A phase-change material which may be suitable for beneficial usages described herein is vanadium dioxide ($VO_2$). According to an embodiment, the phase-change material comprises vanadium dioxide. Although $VO_2$ will be used herein to provide a simple exemplary discussion, it is clear that embodiments of the disclosure may use different phase-change materials with similar thermodynamic, electric and optical properties. Further exemplary phase-change materials include $V_4O_7$, $V_6O_{11}$, $V_2O_3$, $V_6O_{13}$, $V_5O_9$, VO, $V_8O_{15}$, $NbO_2$, $Ti_2O_3$, $LaCoO_3$, $Ti_3O_5$, $SmNiO_3$, $NdNiO_3$, $PrNiO_3$ or $Fe_3O_4$.

$VO_2$ is a semiconductor at room temperature. At 68° C. it undergoes a phase transition into a phase with a high electrical conductivity (which is often called a metallic phase for this reason) and a different refractive index (e.g. measured at $\lambda$=550 nm, n=2.95 at room temperature and n=2.53 at 100° C.). The transition temperature can be lowered from about 68° C. for pure $VO_2$ by introducing a suitable dopant into the crystal (e.g. tungsten, $V_{1-x}W_xO_2$, which has been shown to yield a minimum transition temperature of about 29° C.).

The phase-change material may be thermalized to a temperature slightly below the transition temperature in order to minimize the energy required to induce the phase transition with a suitable domain-inducing component. $VO_2$ can be used for the phase-change material because its transition temperature can be set to a value close to room temperature, as described above, which minimizes the technical effort for thermalization. The array of phase-change material elements may be thermalized in various ways, e.g. by providing a controlled heating element near the array, but out of the optical path, or within a lithographic structure where the programmable metamaterial may be embedded.

As mentioned before, vanadium dioxide changes its refractive index and becomes electrically conductive in its high temperature phase. For this reason, the disclosed programmable metamaterial may be operated in reflective or transmissive mode, depending on the needs of the particular application. Reflective applications may utilize the electrical conductivity of the high-temperature phase to reflect parts of an incident light beam or wave in a programmed geometric pattern, e.g. to create a specific interference effect. In transmissive applications, part of an incident light wave may get slightly deflected according to the particular programmed pattern and the refractive index of the phase-change material at the respective wavelength. For instance, in a 3D array, the extinction caused by the reflective domains may be compensated for a transmitted beam by programming deeper parts of the structure accordingly.

At least one of the phase-change material elements has an assigned domain-inducing component which is capable of supplying a sufficient amount of energy to the assigned phase-change material element to induce the phase transition in a localized region or domain of the phase-change material element. The domain-inducing components may be located at the beginning of the respective phase-change material element in order to keep a sufficient portion of the phase-change material element reserved as a clearance for the optical path.

In some embodiments, multiple domain-inducing components may be implemented per phase-change material element. For example, the phase-change material element may be coupled to two domain-inducing components. This may yield the possibility of programming more than one domain of the same phase-change material element simultaneously. This gain of programming speed goes at the cost of integrity of the light wave emerging the programmed metamaterial as each additional object in the optical path may be a source of scattering or absorption. However, in some embodiments, simultaneously inducing multiple domains into the phase-change material element may be beneficial in circumstances requiring expedited programming speed.

The transitional energy to create a domain may be supplied to the phase-change material elements in a number of different ways. For instance, a domain may be created by heating up a small portion of the phase-change material beyond the transition temperature. According to an embodiment, at least one of the domain inducing components comprises a heating element thermally contacting the assigned phase-change material element. According to an embodiment, the phase transition is induced by locally applying heat to the at least one selected phase-change material element.

Figure 2A:
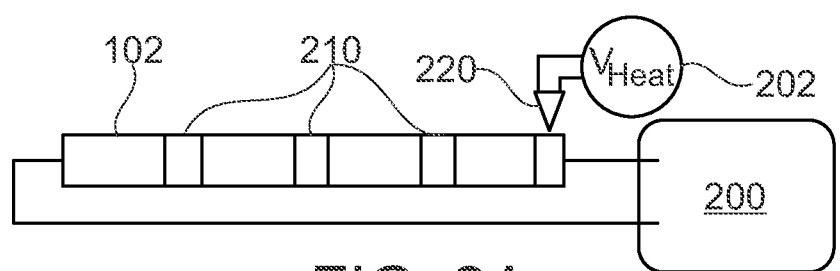
FIG. 2A is a schematic of an phase-change material element with an assigned domain inducing component implemented as a heating element, in accordance with embodiments of the present disclosure.

A schematic diagram of an exemplary implementation of a phase-change material element 102 with a thermal-type domain-inducing component is depicted in FIG. 2A, in accordance with embodiments of the present disclosure. In this setup, the phase-change material element 102 is shown with three conductive domains 210 located around its center and a small heating element 220 located at the right end of the phase-change material element 102.

The phase-change material element 102 is contacted at its two ends in series with a bias control circuitry 200. A domain created with the heating element 220 may be shifted in axial direction by supplying the bias current to the phase-change material element 102 using bias control circuitry 200. The heating element 220 is electrically connected to a programming control circuitry 202, which may facilitate the programming process by providing a means to switch the domain-inducing component on and off. A new domain 210 may be created in the phase-change material element 102 at the position of the domain inducing component by causing the programming control circuitry 202 to apply a non-zero heating voltage $V_{Heat}$ to the heating element 220. $V_{Heat}$ should be greater than a threshold voltage which corresponds to the minimum amount of heat required to induce the phase transition in the specific phase-change material at the given dimensions and thermalization temperature.

The domain-inducing component may also be implemented as a gate electrode, which may serve for creating a domain by a field effect occurring in the phase-change material beneath the gate electrode if a gate voltage $V_{Gate}$ is applied to the gate electrode. According to an embodiment, at least one of the domain inducing components comprises a gate electrode adjoining the assigned phase-change material element. According to an embodiment, the phase transition is induced by locally applying a voltage to the at least one selected phase-change material element.

Figure 2B:
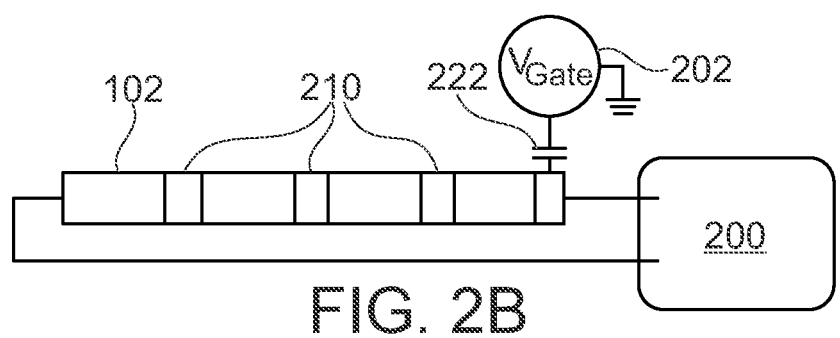
FIG. 2B is a schematic of an phase-change material element with an assigned domain inducing component implemented as a gate electrode, in accordance with embodiments of the present disclosure.

A schematic diagram of an exemplary implementation of a phase-change material element 102 with the assigned domain-inducing component being a switchable gate electrode 222 is depicted in FIG. 2B, in accordance with embodiments of the present disclosure. Again, the gate electrode 222 is electrically connected to a programming control circuitry 202 and $V_{Gate}$ should be greater than a material- and temperature-specific threshold voltage.

A further way of creating a domain in a phase-change material element may be exerting a force on a portion of the phase-change material element. This may be accomplished by a piezo element physically contacting the phase-change material element in a way that it may induce a strain on a portion of the phase-change material element. According to an embodiment, at least one of the domain inducing components comprises a piezo element contacting the assigned phase-change material element. According to an embodiment, the phase transition is induced by locally inducing strain to the at least one selected phase-change material element.

Figure 2C:
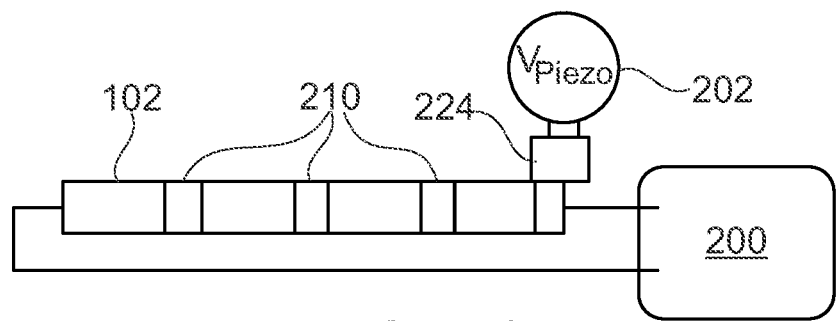
FIG. 2C is a schematic of an phase-change material element with an assigned domain inducing component implemented as a piezo element, in accordance with embodiments of the present disclosure.

FIG. 2C shows a schematic diagram of an exemplary implementation of a phase-change material element 102 where the domain-inducing component is a piezo element 224, in accordance with embodiments of the present disclosure. The piezo element 224 is electrically connected to a programming control circuitry 202. If a voltage $V_{Piezo}$ exceeding a corresponding threshold voltage is applied to the piezo element 224, the piezo crystal may extend in a direction perpendicular to the axial direction of the phase-change material element 102, exerting a force on the portion of the phase-change material element 102 underneath the crystal. In this case, the phase transition is likewise induced if the strain and its equivalent piezo voltage $V_{Piezo}$ exceed a respective temperature- and material-dependent threshold value.

Yet another method of creating a domain by inducing a phase transition in the phase-change material element may be passing a current pulse through the phase-change material element. For this purpose, the bias control circuitry 200 of the phase-change material element may contain a pulse generator. According to an embodiment, at least one of the domain inducing components comprises a current pulse generator connected in series with the assigned phase-change material element. According to an embodiment, the phase transition is induced by sending a current pulse through the at least one selected phase-change material element.

The pulse can exceed a temperature- and material-specific threshold height in order to provide the needed amount of energy for the transition. As the current pulse through bias control circuitry 200 also causes the domains in the phase-change material element to move axially, its duration should be selected carefully in order to produce a domain with the desired length.

The domain-inducing component may be capable of reversing the phase transition. The phase-change material may undergo the phase transition reversibly in a forward and a backward direction. In the example of vanadium dioxide, the forwards phase transition would be changing from the low temperature insulating state into the high temperature conducting state and the backwards direction would be changing from the high temperature state to the low temperature state.

Each of the previously described implementations for the domain-inducing components may be used to induce the phase transition in backwards direction, which corresponds to deleting or erasing a previously created domain. The heating element or 'hot tip' can only be heated if a non-zero heating voltage $V_{Heat}$ is applied. Therefore, cooling may be accomplished with a heating element if $V_{Heat}$ is kept at an intermediate voltage level between zero and the threshold voltage for programming. While a domain in the high-energy phase may be created by increasing the heating voltage from the intermediate bias level to a level above a threshold voltage, the temperature of the heating element may be lowered relative to its temperature at the bias voltage by setting the heating voltage $V_{Heat}$ to zero. Due to thermalization, both phases are stable at the intermediate bias voltage, while a return to $V_{Heat}=0$ may locally reduce the internal energy of the phase-change material so far that the latent heat induced during the forwards transition is recovered and the phase transition takes place in a backwards direction.

If the domain-inducing components are implemented as gate electrodes, the phase transition may be reverted by reversing the polarity of the gate voltage $V_{Gate}$. This may invert the electric field inside the programming region of the phase-change material such that the field effect which caused the phase transition in forwards direction is reversed and the phase transition takes place in the backwards direction.

Typically, the phase transition is a fast process which may take place on nano- to picosecond scales in the case of $VO_2$. Therefore, domain-inducing mechanisms with a short response time, such as the gate electrode implementation, can be used to maximize the programming speed of the programmable metamaterial.

The phase-change material elements may be electrically contacted by at least two bias electrodes. This may greatly enhance the number of patterns or topologies which can be programmed on each of the contacted phase-change material elements, as this allows for shifting or moving the domains which have been created in the phase-change material, utilizing local thermoelectric or Peltier effects caused by the electrical current in the domain walls. The direction of domain movement can be selected by setting the polarity of the current accordingly. The shifting speed is a function (e.g. proportional) of the intensity of the current. The current applied to a phase-change material element does not necessarily have to be a direct current (DC), but it may be kept at a constant polarity in order to maintain a constant shifting direction.

Besides shifting, the additional programming operation of stopping the shifting can be implemented for the contacted phase-change material elements by setting the bias current to zero.

The domain walls react sensitively on electrical current. In the example of $VO_2$, repetition rates (inverse time taken to shift one domain across the whole length of a phase-change material element) in the MHz range have been achieved with phase-change material elements with an aspect ratio of 200×100×760 nm and currents in the range of 100-200 µA per phase-change material element. Hence, the disclosed programmable metamaterial may offer not only the possibility to create a metamaterial with time dependence optical properties, it may also be deployed in applications which require real time or high-frequency optical switching and/or image processing.

Figure 3:
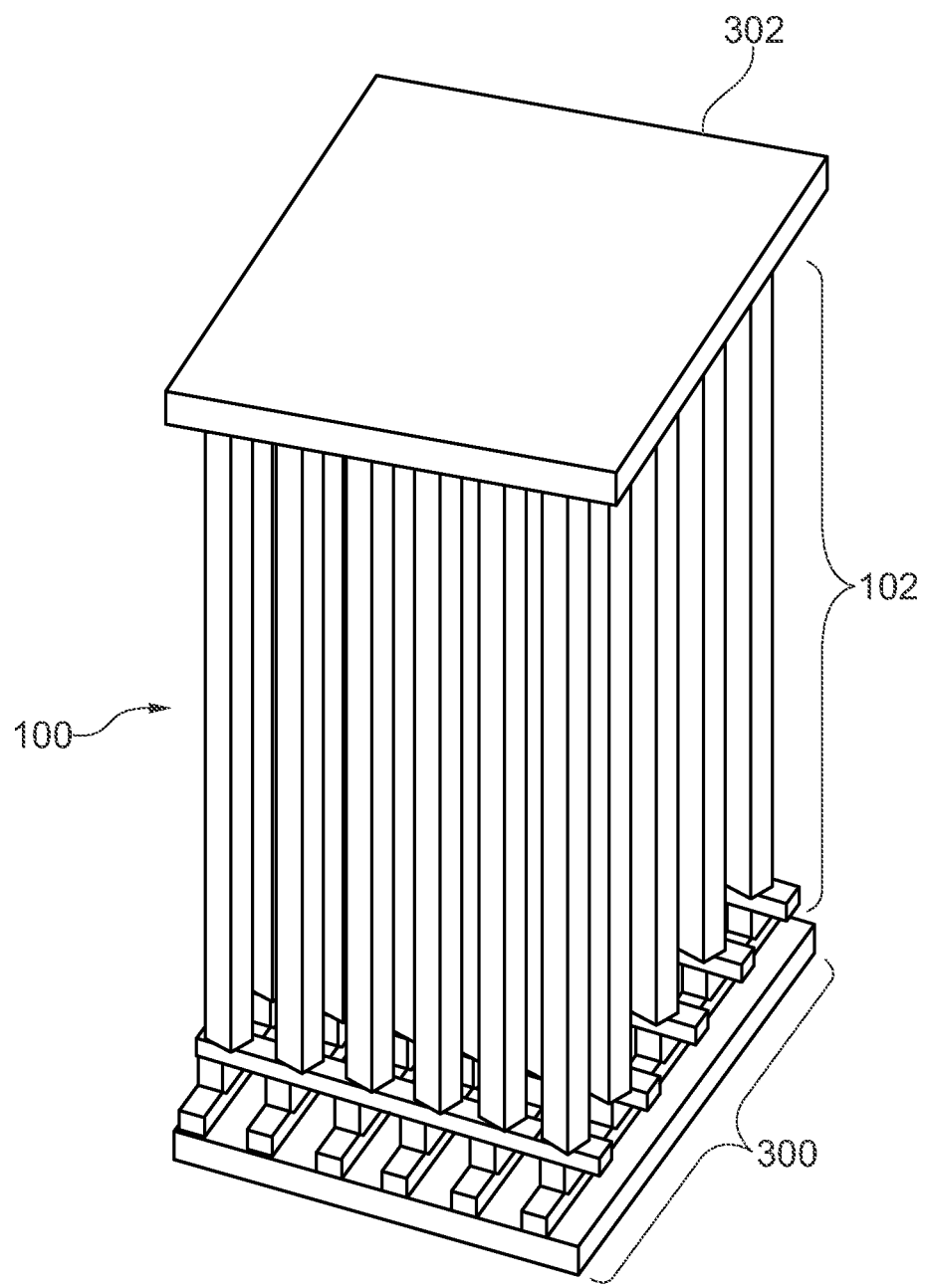
FIG. 3 is a schematic of an array of phase-change material elements electrically contacted by a crossbar switch and a ground plate, in accordance with embodiments of the present disclosure.

According to an embodiment, one of the bias electrodes is a switching contact of a crossbar switch. FIG. 3 shows a schematic diagram of an exemplary implementation of an array 100 of phase-change material elements 102 which are electrically contacted by switching contacts of a crossbar switch 300 at the bottom and a ground plate 302 comprising a matrix of ground connectors at the top, in accordance with embodiments of the present disclosure. Such setup may allow for switching the bias currents for the phase-change material elements individually. The switching contacts of the crossbar switch 300 may be controlled by a suitable programmable logic such as a field programmable gate array (FPGA).

A similar control mechanism, but with horizontal electrical connectors, may be applied to switch the domain-inducing component (not shown in FIG. 3) for each phase-change material element individually.

According to an embodiment, the method further comprises shifting the domain by applying a bias current to the at least one selected phase-change material element. According to an embodiment, the method further comprises stopping the shifting by setting the bias current to zero.

Many different programming schemes making advantageous use of methods according to embodiments are possible to create metastructures of phase-change domains in the array of phase-change material elements. Two exemplary, but not exhaustive, methods for programming a single selected phase-change material element for this purpose will be discussed with reference to FIGS. 4-6 in the following.

One programming method comprises intermittently creating and shifting domains in each phase-change material element to be programmed. According to an embodiment, the programming comprises performing the following steps for each of the at least one selected phase-change material element:
  a) Setting a bias current through the phase-change material element to zero;
  b) For each of the at least one domain:
    i. Locally changing the refractive index of the phase-change material by inducing the phase transition with the domain-inducing component;
    ii. Optionally, shifting the domain through the phase-change material element by setting the bias current to a non-zero value for a pre-determined traveling time;
  c) Optionally, continuing the programming by returning to step a); and
  d) Finishing the programming by setting the bias current to zero.

Figure 4:
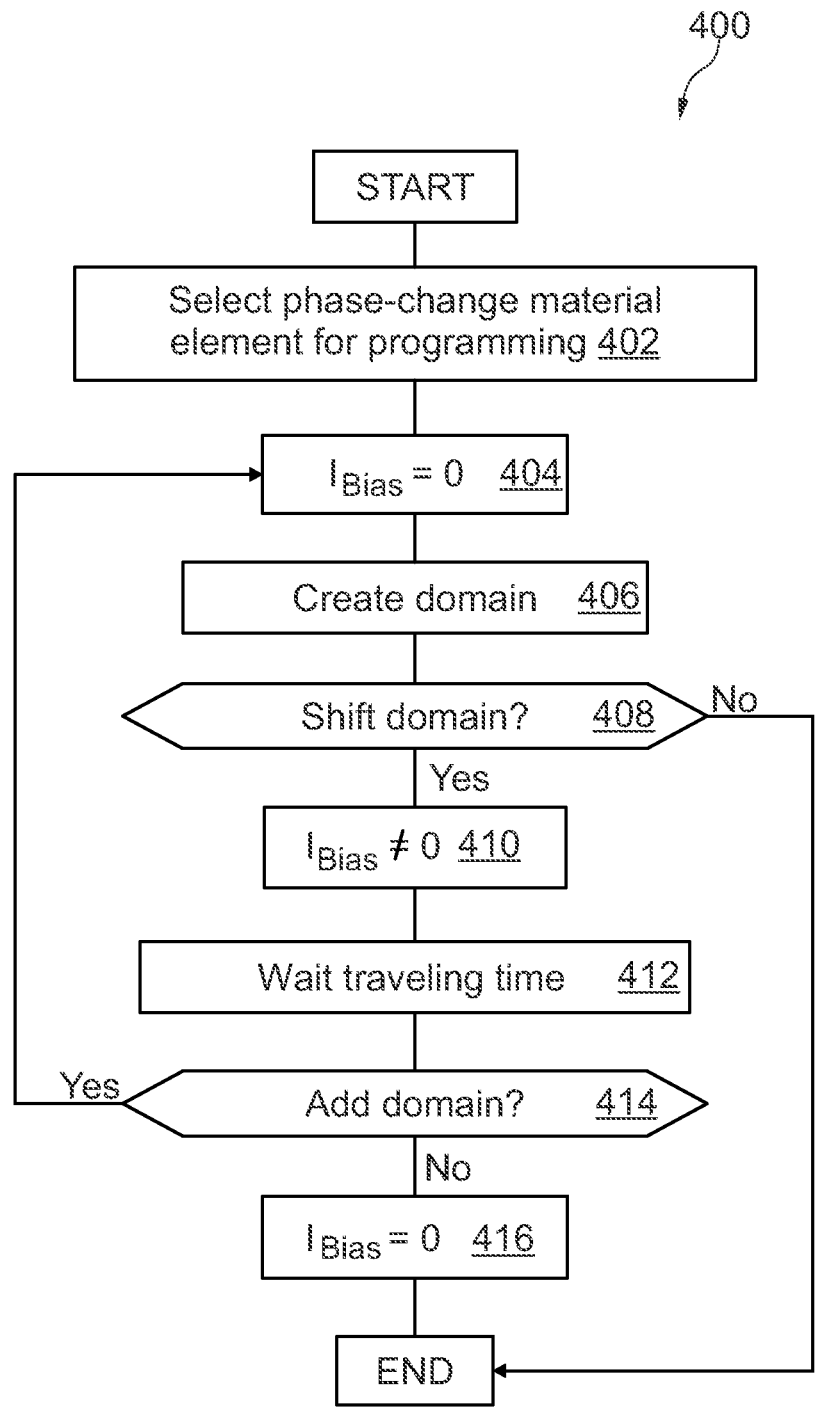
FIG. 4 is a flow diagram illustrating an intermittent programming procedure, in accordance with embodiments of the present disclosure.

An exemplary intermittent programming scheme 400 is illustrated by the flow diagram shown in FIG. 4, in accordance with embodiments of the present disclosure. The scheme starts with selecting 402 a particular phase-change material element for programming. To create a new domain in the selected phase-change material element, the bias current is set 404 to zero. Then, a new domain is created 406 using a domain-inducing component of the selected phase-change material element. The new domain may be shifted 408 to a target position afterwards. If the new domain is not to be shifted, the procedure ends. If the new domain shall be shifted to a target position, the bias current is set 410 to a suitable non-zero value. The bias control circuitry then waits 412 a predetermined traveling time which depends on the distance between the domain-inducing component and the target position and the traveling speed which corresponds to the set non-zero bias current. In an intermittent programming scheme, a direct current (DC) may be beneficial to simplify the calculation of the traveling time. When the new domain has reached its target position, another domain may be created 414 by repeating the programming from step 404. If no additional domain is to be created, the bias current is set 416 to zero again in order to fix the positions of all domains which may be present in the selected phase-change material element. Programming scheme 400 then ends for the selected phase-change material element.

The target position for a particular new domain is not necessarily its final position in the intended metastructure to be realized when the programming is finished for all selected phase-change material elements. It may instead be merely a distance relative to the domain-inducing component which corresponds to the intended distance to a subsequent domain to be created by repetition of the procedure after the particular domain has reached its target position. Once the bias current is applied to the phase-change material element, all domains which are present on the phase-change material element will move into the same direction.

Depending on the size of the domain-inducing component in axial direction, newly created domains have a finite standard size. The intermittent programming procedure may, however, also be used to create domains which are larger than the standard size. For this purpose, the traveling time may be set to a short value in order to shift the new domain not further than the standard size. When the bias current is set to zero and the programming procedure is repeated, the subsequently created domain will overlap with the shifted domain to yield a domain which is larger than the standard domain size. In this way, larger domains may be created with an arbitrary size, which is not necessarily a multiple of the standard domain size. The domain-inducing components may be beneficially manufactured as small as possible to increase the programming resolution of the metastructure. However, this may slow down programming at least if the intermittent programming procedure is applied. Implementations using the intermittent procedure should therefore be designed under a decision between the two alternatives of speed or resolution.

The intermittent programming procedure is illustrated further by the schematic sequence of diagrams shown in FIGS. 5A-E. In this sequence, only the domain-inducing mechanism using a gate is shown. However, the sequence may readily applied using any of the other aforementioned domain-inducing mechanisms, as will be clear for those skilled in the art. In this sequence, two separate domains are created and shifted towards the center of a phase-change material element 102. At the beginning of the sequence (FIG. 5A), the phase-change material element 102 is in cleared state (e.g. insulating) across the whole of its length. A domain-inducing component implemented as a gate electrode 222, with a corresponding ground electrode on the radially opposite side of the phase-change material element 102, is located towards the left end of the phase-change material element 102. The gate electrode 222 is connected to a voltage source in series with a programming switch 500.

Gate electrode 222 and the ground electrode are positioned closely to the phase-change material element 102 perpendicular to the axial direction, but without electrical contact, such that no current is introduced in the phase-change material when a phase transition is induced by closing the programming switch 500 of the domain-inducing component, the domain being rather created only by the electrical field between the gate electrode 222 and the ground electrode. An electrical contact of the gate electrode 222 or the ground electrode with the phase-change material element 102 may be avoided for instance by providing a thin insulating layer or coating between the phase-change material element 102 and the respective electrode.

Figure 5A:
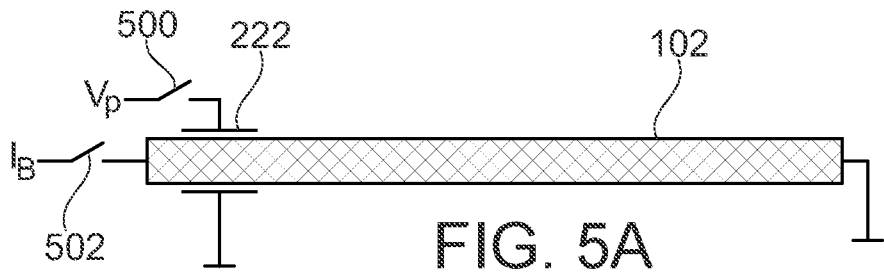
FIG. 5A is a schematic of a cleared phase-change material element, in accordance with embodiments of the present disclosure.

The left end of the phase-change material element 102 is connected to a bias current source by a bias electrode connected in series with a bias switch 502. The right end of the phase-change material element 102 is grounded by another bias electrode 502. If the bias switch 502 is closed, an electric current will flow through the phase-change material element 102 in axial direction. In FIG. 5A, no programming operation is performed since both switches 500, 502 are open.

Figure 5B:
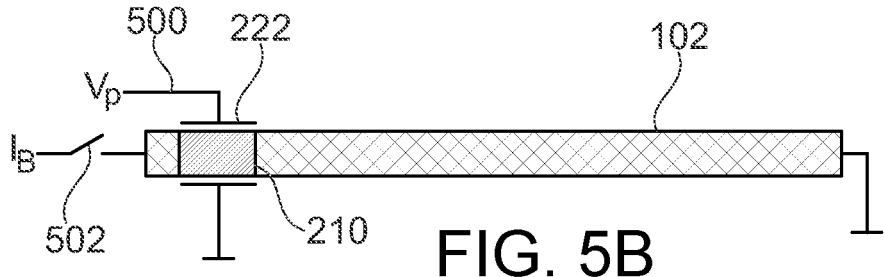
FIG. 5B is a schematic of a phase-change material element being programmed with one domain, in accordance with embodiments of the present disclosure.
Figure 5C:
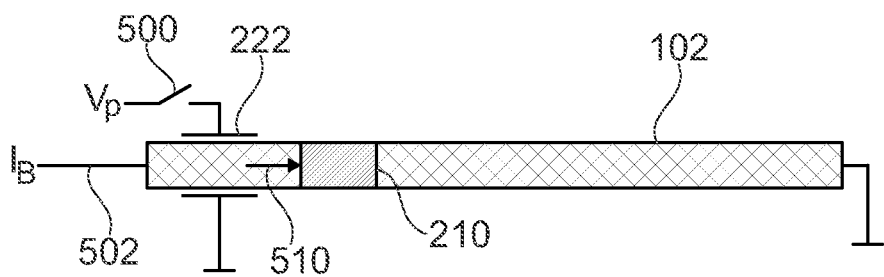
FIG. 5C is a schematic of one domain being shifted through a phase-change material element, in accordance with embodiments of the present disclosure.
Figure 5D:
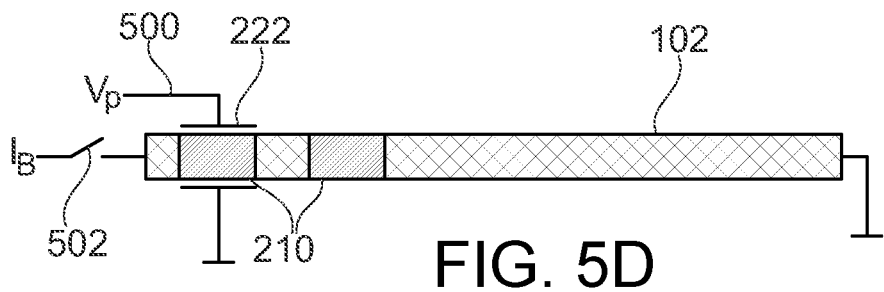
FIG. 5D is a schematic of a phase-change material element being programmed with a second domain, in accordance with embodiments of the present disclosure.
Figure 5E:
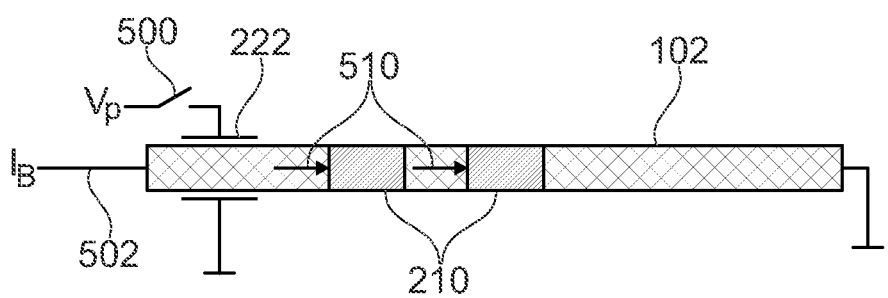
FIG. 5E is a schematic of two domains being shifted through a phase-change material element, in accordance with embodiments of the present disclosure.

In FIG. 5B a new domain 210 of programmed (e.g. conducting) state is created as the programming switch 500 is closed. The newly created domain 210 stays between the two gate electrodes 222 as the bias switch 502 is still open. Once the creation of domain 210 is completed, the programming switch 500 is opened and the bias switch 502 is closed. FIG. 5C illustrates the movement of the new domain 210 by an arrow indicating its moving direction 510. In FIG. 5D the bias switch 502 is opened again and the programming switch 500 is closed again. The shifting operation shown in FIG. 5C has moved the domain 210 towards the center and the trailing domain wall is separated from the boundaries of the gate electrodes 222 by a gap. A second domain 210 is created between the gate electrodes 222 by a new electric field in response to the closing of the programming switch 500. In FIG. 5E, the intermittent operation is completed again by opening the programming switch 500 and closing the bias switch 502. Both domains 210 move now further towards the grounded end of the phase-change material element 102.

An alternative way of programming a selected phase-change material element utilizes the fact that the switches for programming and biasing may be operated independent from each other to form a non-intermittent or continuous programming scheme. According to an embodiment, the programming comprises performing the following steps for each of the at least one selected phase-change material element:

a) Setting a bias current through the phase-change material element to a non-zero value;
b) For each of the at least one domain:
  i. Starting the domain by locally inducing the phase transition in forward direction;
  ii. Waiting a predetermined expansion time;
  iii. Terminating the domain by locally inducing the phase transition in backward direction;
  iv. Waiting a predetermined traveling time;
c) Optionally, continuing the programming by returning to step Error! Reference source not found;
d) Finishing the programming by setting the bias current to zero.

Figure 6:
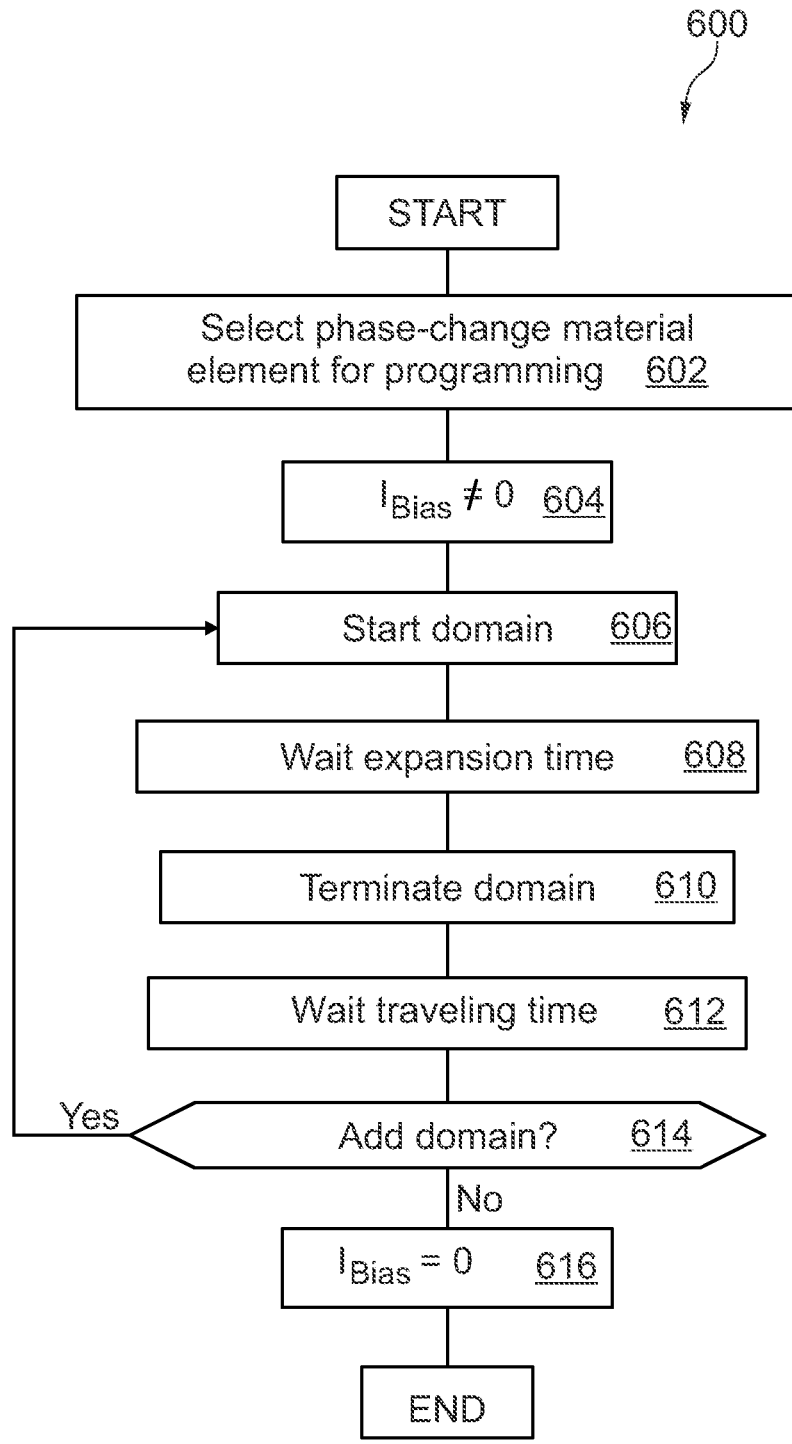
FIG. 6 is a flow diagram illustrating a non-intermittent programming procedure, in accordance with embodiments of the present disclosure.

An exemplary non-intermittent programming scheme 600 is depicted in FIG. 6. In programming scheme 600 the domain transport, or equivalently, the bias current is not interrupted while the domain programming takes place. First, the phase-change material element is selected 602 for programming. The bias current is set 604 to a non-zero value to initiate domain transport. A new domain is started 606 by closing the switching contact of the domain-inducing component.

As the bias current is not zero, the leading wall of the new domain will extend into the transport direction while the phase transition is continued to be induced in a programming volume defined by the axial size of the domain-inducing component or the duration of the current pulse. If a current pulse is used to create the domain, the domain size is completely governed by the pulse duration and no additional biasing is needed during programming. Programming scheme 600 therefore rather corresponds to setups with an off-axis domain-inducing component like those shown in FIGS. 2A-C.

The two switches remain unchanged for a predefined expansion time. During this time the started domain is allowed to expand 608 up to the desired size for realizing the desired metastructure for the metamaterial to be programmed. The expansion time can be calculated as a function of the bias current strength corresponding to the transport velocity. When the new domain has reached the desired size, the programming switch is opened to terminate 610 the domain. The bias current is maintained 612 further for a predefined traveling time, allowing for a movement of the new domain at the set traveling velocity until it has reached a target position or a predetermined distance from the domain-inducing component. Optionally, a further domain may be added 614 by repeating the procedure from step 606. If no further domains are to be added after the traveling time, the bias current is set 616 to zero in order to finish the programming of the selecting phase-change material element.

Both the expansion time and the traveling time may be selected sufficiently large for covering or exceeding the full length of the phase-change material element. An expansion time which is longer than the time needed for a complete coverage of the phase-change material elements may yield the phase-change material element entirely in the conducting phase, while a traveling time which is larger than the time needed to transport a domain through the entire length of the phase-change material element may result in a cleared, deleted or erased phase-change material element which is entirely in the original insulating phase.

While not being a preferred implementation, it should be noted however that the phase-change material elements may likewise be programmed inversely, i.e. by defining the conducting or high-energy state of the phase-change material as cleared or 'zero' and the insulating or low-energy state as programmed or 'one'. In this case it may be advantageous to provide the domain-inducing components with a technique which cools down the programming region of the phase-change material elements when activated, an instance being a thermoelectric or Peltier element attached to its assigned phase-change material element.

The programmable metamaterial may comprise one or more of the phase-change material elements which are present in the array, but naturally also by programming the whole array of phase-change material elements. This may provide a highly flexible approach for creating a metamaterial with precisely bespoke properties for a particular application.

Figure 7:
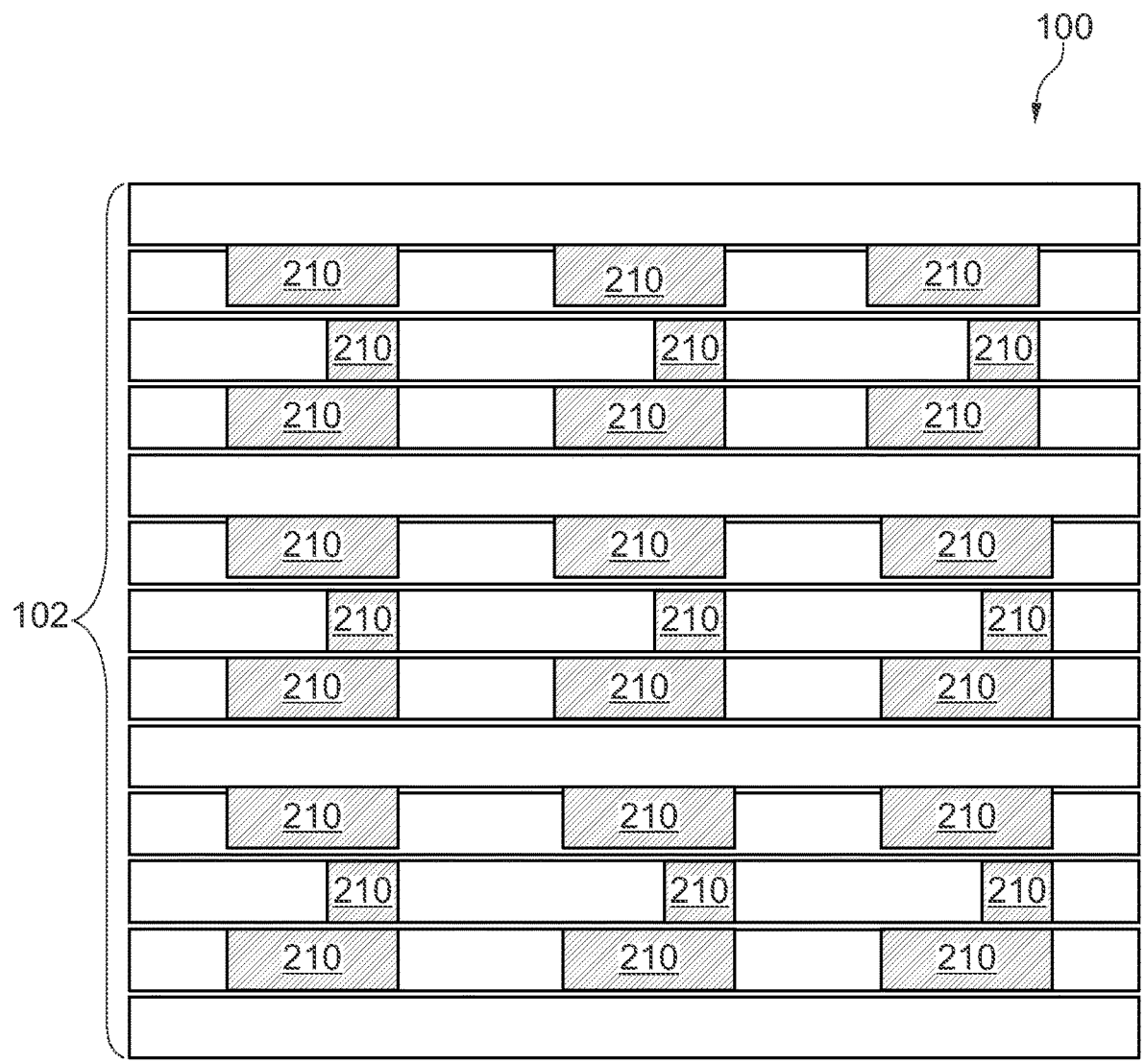
FIG. 7 is a schematic of an array of phase-change material elements programmed with a metastructure of domains, in accordance with embodiments of the present disclosure.

FIG. 7 shows an exemplary metastructure which may be programmed with a one-dimensional array 100 of phase-change material elements 102 or metasurface, or likewise a row or column of a two-dimensional array of phase-change material elements according to embodiments of the disclosure. Thirteen phase-change material elements 102 are arranged in parallel and shown as a stack. Starting from the top of the stack, the first phase-change material element 102 is in cleared state, i.e. no domains are present on the first element. The second element 102 contains three domains 210 of identical length which are separated by two gaps of approximately the same length as the domains. The third element 102 contains three domains 210 of about 40% the length of the three domains 210 in the second element 102 and aligned with the right-hand side of the three domains 210 in the second element 102. The fourth phase-change material element 102 contains three domains 210 in an identical pattern to that of the second element 102. The described pattern of elements 1-4 is repeated identically with elements 5-8 and 9-12. The thirteenth element at the bottom of the depicted stack is in cleared state.

The depicted metastructure may yield a metamaterial which is selective for circular polarization in one direction. In the depicted orientation, the metastructure would be reflective for light in left-handed or counter-clockwise polarization due to induction of resonant currents in the conducting domains 210.

A few illustrative examples for possible applications of the disclosed programmable metamaterial are mentioned in the following. The particular selection of given examples is purely illustrative and shall in no way be construed as limiting the possible number of technical fields, environments, systems or devices where the disclosed programmable metamaterial may be deployed. According to an embodiment, the programmable metamaterial is one of the following: an optical computing device, a hologram, or an image projector.

One possible application may be in the field of optical computing. For instance, a programmable accelerator could be realized for processing, e.g. mathematical information transported by a light signal. In a usage scenario, the programmable metamaterial may be programmed such that a passing wave packet transporting a profile of a mathematical function is influenced such that the function transported by the emerging wave packet is the Fourier transform of the function carried by the incident wave packet. After completion of this mathematical operation, the programmable metamaterial may be reprogrammed to serve as a different metamaterial which influences a second incident wave packet such that the function transported by the incident wave package is converted into its first derivative in the emerging wave packet. Possible deployment environments for a programmable accelerator include neuromorphic optical computing systems and optical signal processing in telecommunication applications.

Due to the high repetition rates which may be achieved with the disclosed programmable metamaterial, further applications in the field of image processing and displaying technologies may be possible. The programmable metamaterial may for example be programmed in a pattern which resembles pixeled image information to serve as a programmable imaging element of a display device or an image projector. Real time and video applications appear likewise possible as static applications like programmable holograms.

This concept may be generalized towards 3D optical data storage or memory with a high data density, utilizing the ability of the phase-change material to remain in its programmed state practically without any losses at least as long as thermalization is maintained. Appropriate choices of phase-change materials and combination with refined programming schemes which utilize, for example, time-dependent programming signals with a particular time profile, may even enable a permanent programming of the phase-change material such that the programmable metamaterial may eventually serve as a non-transitory optical data storage.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

The invention claimed is:

1. A three-dimensional programmable metamaterial comprising:
    an array of phase-change material elements arranged in two-dimensions; and
    a domain inducing component coupled to at least one phase-change material element of the array of phase-change material elements, wherein the domain inducing component is configured to program the refractive index of the at least one phase-change material element and reprogram the refractive index of the at least one phase-change material element by inducing a phase transition in a domain of the at least one phase-change material element.

2. The programmable metamaterial of claim 1, wherein the at least one phase-change material element is electrically contacted by a bias electrode on each end.

3. The programmable metamaterial of claim 2, wherein the bias electrode is a switching contact of a crossbar switch.

4. The programmable metamaterial of claim 2, wherein the domain inducing component includes a current pulse generator connected in series with the at least one phase-change material element.

5. The programmable metamaterial of claim 1, wherein the domain inducing component includes a heating element configured to thermally contact the at least one phase-change material element.

6. The programmable metamaterial of claim 1, wherein the domain inducing component includes a gate electrode configured to electrically contact the at least one phase-change material element.

7. The programmable metamaterial of claim 1, wherein the domain inducing component includes a piezo element configured to contact the at least one phase-change material element to exert a force to induce a strain on a portion of the at least one phase-change material element.

8. The programmable metamaterial of claim 1, wherein the array of phase-change material elements includes vanadium dioxide.

9. The programmable metamaterial of claim 1, wherein each of the phase-change material elements has a diameter between 1 nm and 100 μm.

10. The programmable metamaterial of claim 1, further comprising:
    a second domain inducing component coupled to the at least one phase-change material element.

11. The programmable metamaterial of claim 1, wherein the programmable metamaterial is included in at least one of an optical computing device, a hologram, and an image projector.

12. A method for programming a three-dimensional metamaterial, the method comprising:
    selecting a phase-change material element of an array of phase-change material elements arranged in two dimensions for programming; and
    programming the refractive index of the selected phase-change material element by inducing a phase transition in a domain of the selected phase-change material element.

13. The method of claim 12, further comprising:
    shifting the domain by applying a bias current to the selected phase-change material element.

14. The method of claim 13, further comprising:
    stopping the shifting by setting the bias current to zero.

15. The method of claim 12, the method further comprising:
    setting a bias current through the phase-change material element to zero;
    changing the refractive index of the phase-change material element by inducing the phase transition in the domain;
    shifting the domain through the phase-change material element by setting the bias current to a non-zero value for a pre-determined traveling time; and
    setting the bias current to zero immediately after the pre-determined traveling time.

16. The method of claim 12, the method further comprising:
    setting a bias current through the phase-change material element to a non-zero value;
    inducing the phase transition in a forward direction;
    waiting a predetermined expansion time;
    terminating the domain by locally inducing the phase transition in a backward direction;
    waiting a predetermined traveling time; and
    setting the bias current to zero immediately after the predetermined traveling time.

17. The method of claim 12, wherein the phase transition is induced by locally applying heat to the selected phase-change material element.

18. The method of claim 12, wherein the phase transition is induced by locally applying a voltage to the selected phase-change material element.

19. The method of claim 12, wherein the phase transition is induced by locally applying strain to the selected phase-change material element.

20. The method of claim 12, wherein the phase transition is induced by sending a current pulse through the selected phase-change material element.

* * * * *